US009473094B2

(12) United States Patent
Talwar et al.

(10) Patent No.: US 9,473,094 B2
(45) Date of Patent: Oct. 18, 2016

(54) AUTOMATICALLY CONTROLLING THE LOUDNESS OF VOICE PROMPTS

(71) Applicant: General Motors LLC, Detroit, MI (US)

(72) Inventors: Gaurav Talwar, Novi, MI (US); Xufang Zhao, Windsor (CA); Eli Tzirkel-Hancock, Ra'anana (IL)

(73) Assignee: General Motors LLC, Detroit, MI (US)

( * ) Notice: Subject to any disclaimer, the term of this patent is extended or adjusted under 35 U.S.C. 154(b) by 41 days.

(21) Appl. No.: 14/286,182

(22) Filed: May 23, 2014

(65) Prior Publication Data

US 2015/0341005 A1   Nov. 26, 2015

(51) Int. Cl.

| | |
|---|---|
| *G10L 15/20* | (2006.01) |
| *H03G 3/00* | (2006.01) |
| *G10L 15/00* | (2013.01) |
| *G10L 25/60* | (2013.01) |
| *G10L 15/26* | (2006.01) |
| *H03G 3/30* | (2006.01) |
| G10L 25/69 | (2013.01) |
| G10L 25/84 | (2013.01) |

(52) U.S. Cl.
CPC ............... *H03G 3/00* (2013.01); *G10L 15/00* (2013.01); *G10L 15/26* (2013.01); *G10L 25/60* (2013.01); *H03G 3/3005* (2013.01); *G10L 25/69* (2013.01); *G10L 25/84* (2013.01)

(58) Field of Classification Search
CPC ....... G10L 15/22; G10L 25/78; G10L 25/21; G10L 15/26; G10L 13/00; G10L 15/04; G10L 15/1822
USPC ....... 704/251, 246, 275, 257, 226–228, 233, 704/249, 225; 370/88.01–88.02, 88.14, 370/88.18; 340/539.13, 540; 379/88.01–88.02, 88.14, 88.18
See application file for complete search history.

(56) References Cited

U.S. PATENT DOCUMENTS

| | | | | |
|---|---|---|---|---|
| 5,267,322 | A * | 11/1993 | Smith | H03G 3/3026 375/345 |
| 5,970,452 | A * | 10/1999 | Aktas | G10L 25/78 704/233 |
| 6,061,651 | A * | 5/2000 | Nguyen | G01L 25/78 379/67.1 |
| 6,785,365 | B2 * | 8/2004 | Nguyen | G10L 25/78 379/406.01 |
| 8,762,151 | B2 * | 6/2014 | Correia | G10L 15/22 704/253 |
| 2002/0021789 | A1 * | 2/2002 | Nguyen | G10L 25/78 379/88.01 |
| 2003/0171925 | A1 * | 9/2003 | Werner | G06F 17/30876 704/270.1 |
| 2004/0044525 | A1 * | 3/2004 | Vinton | H03G 5/165 704/224 |
| 2004/0210443 | A1 * | 10/2004 | Kuhn | G10L 15/22 704/276 |
| 2005/0033582 | A1 * | 2/2005 | Gadd | G06Q 30/02 704/277 |
| 2006/0143007 | A1 * | 6/2006 | Koh | G10L 15/22 704/243 |
| 2009/0238386 | A1 * | 9/2009 | Usher | G10L 13/00 381/315 |
| 2010/0333163 | A1 * | 12/2010 | Daly | H04N 5/4403 725/133 |
| 2011/0169632 | A1 * | 7/2011 | Walker | H03G 3/32 340/539.13 |

* cited by examiner

*Primary Examiner* — Vijay B Chawan
(74) *Attorney, Agent, or Firm* — Christopher DeVries; Reising Ethington P.C.

(57) ABSTRACT

A system and method of regulating automatic speech recognition (ASR) playback of audible prompts includes: generating an audible prompt via a speaker; detecting ambient sound during the audible prompt via a microphone; obtaining a speech recognition confidence value for speech recognition performed on the ambient sound; and reducing a volume level of the audible prompt based on the speech recognition confidence value while continuing to generate the audible prompt.

9 Claims, 3 Drawing Sheets

AUTOMATICALLY CONTROLLING THE LOUDNESS OF VOICE PROMPTS

TECHNICAL FIELD

The present invention relates to automatic speech recognition (ASR) systems and, more particularly, to controlling the volume level of voice prompts generated by ASR systems.

BACKGROUND

Automatic speech recognition (ASR) systems use microphones and speakers to generate audible voice prompts to users and then receive speech in response to those voice prompts. The received speech can then be analyzed to determine its content. ASR systems generally deliver the audible voice prompts to the user as part of a conversational exchange between the ASR system and the user. However, designers of ASR systems also recognize that the systems may not always be able to appreciate when the generated audible prompts are not providing helpful information. To remedy this, the ASR systems can listen for speech from the user while the audible prompt is played. When the user speaks while the audible prompt is played, the ASR system can immediately end the prompt and begin analyzing the incoming speech. However, sometimes the ASR system detects sound other than the user's voice. When that occurs, the ASR system may interrupt prompts even though the user remained silent. The interruption of audible prompts caused by sounds other than the user's voice can cause frustration and reduce ASR performance and/or satisfaction.

SUMMARY

According to an embodiment, there is provided a method of regulating automatic speech recognition (ASR) playback of audible prompts. The method includes generating an audible prompt via a speaker detecting ambient sound during the audible prompt via a microphone; obtaining a speech recognition confidence value for speech recognition performed on the ambient sound; and reducing a volume level of the audible prompt based on the speech recognition confidence value while continuing to generate the audible prompt.

According to another embodiment, there is provided a method of regulating automatic speech recognition (ASR) playback of audible prompts. The method includes generating an audible prompt in the vehicle via a speaker; detecting ambient sound within the vehicle via an in-vehicle microphone; performing speech recognition on the ambient sound: obtaining a speech recognition confidence value for the speech recognition performed on the ambient sound; and reducing a volume level of the audible prompt in relation to the speech recognition confidence value.

BRIEF DESCRIPTION OF THE DRAWINGS

One or more embodiments of the invention will hereinafter be described in conjunction with the appended drawings, wherein like designations denote like elements, and wherein.

DETAILED DESCRIPTION OF THE ILLUSTRATED EMBODIMENTS

The system and method described below regulates playback of audible prompts based on the absence or presence of human speech during those prompts. When an automatic speech recognition (ASR) system generates audible prompts to a user, it can simultaneously listen for ambient sound occurring nearby. The ambient sound could include utterances by a user attempting to interact with the ASR system or it could be background noise, such as a cough or a dog barking. The ASR system can determine if the ambient sound includes background noise or speech from a user of the ASR system and control the audible prompt based on this determination. For instance, if the ambient sound includes user speech, the ASR system can end the audible prompt and continue receiving speech from the user. However, if the ASR system determines that the ambient sound includes background noise, the ASR system can then reduce the volume level of the audible prompt while continuing to play the prompt. In some implementations, the amount of volume level reduction can be controlled by a speech recognition confidence value obtained by performing speech recognition on the ambient sound received during the prompt.

Figure 1:
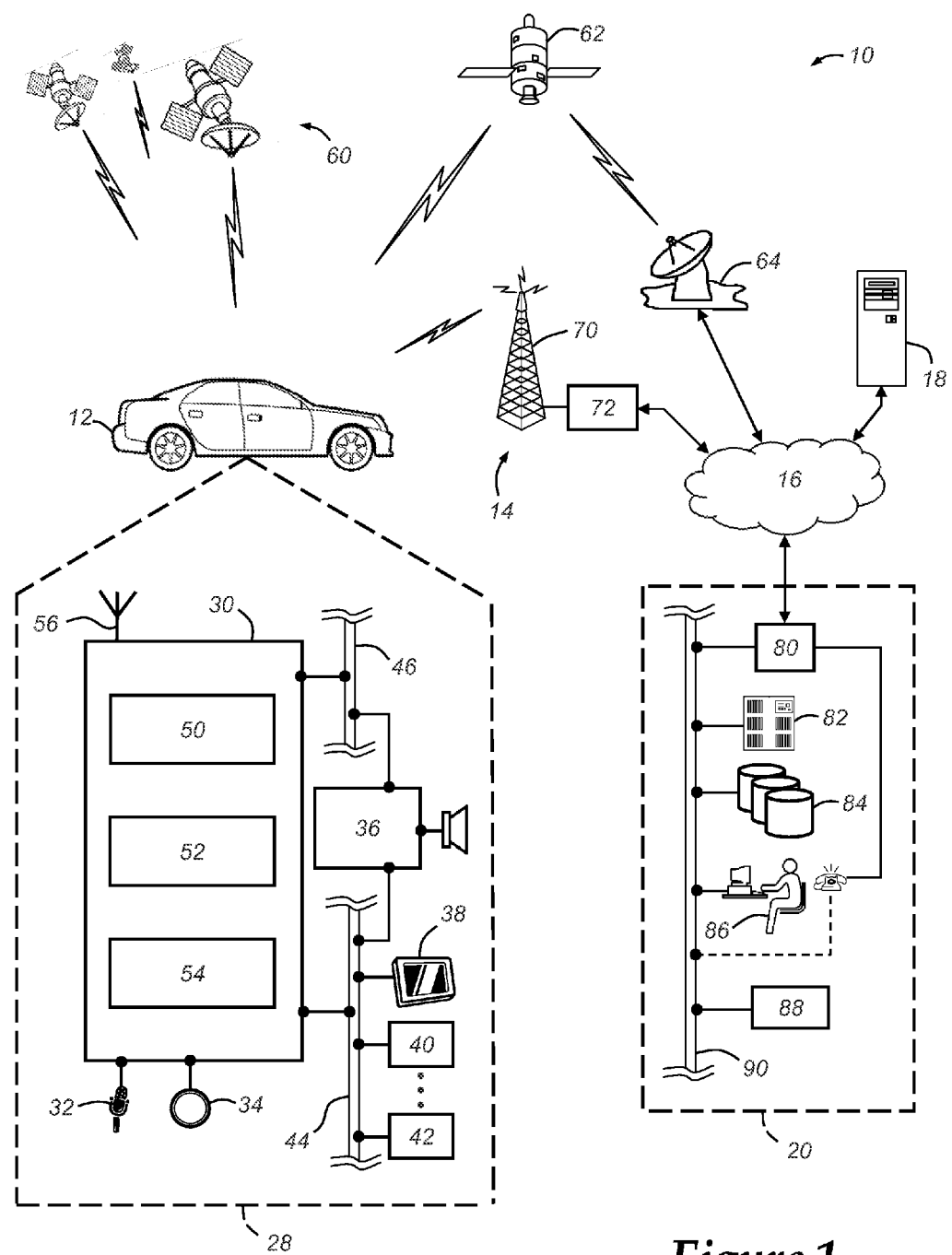
FIG. 1 is a block diagram depicting an embodiment of a communications system that is capable of utilizing the method disclosed herein.

With reference to FIG. 1, there is shown an operating environment that comprises a mobile vehicle communications system 10 and that can be used to implement the method disclosed herein. Communications system 10 generally includes a vehicle 12, one or more wireless carrier systems 14, a land communications network 16, a computer 18, and a call center 20. It should be understood that the disclosed method can be used with any number of different systems and is not specifically limited to the operating environment shown here. Also, the architecture, construction, setup, and operation of the system 10 and its individual components are generally known in the art. Thus, the following paragraphs simply provide a brief overview of one such communications system 10; however, other systems not shown here could employ the disclosed method as well.

Vehicle 12 is depicted in the illustrated embodiment as a passenger car, but it should be appreciated that any other vehicle including motorcycles, trucks, sports utility vehicles (SUVs), recreational vehicles (RVs), marine vessels, aircraft, etc., can also be used. Some of the vehicle electronics 28 is shown generally in FIG. 1 and includes a telematics unit 30, a microphone 32, one or more pushbuttons or other control inputs 34, an audio system 36, a visual display 38, and a GPS module 40 as well as a number of vehicle system modules (VSMs) 42. Some of these devices can be connected directly to the telematics unit such as, for example, the microphone 32 and pushbutton(s) 34, whereas others are indirectly connected using one or more network connections, such as a communications bus 44 or an entertainment bus 46. Examples of suitable network connections include a controller area network (CAN), a media oriented system transfer (MOST), a local interconnection network (LIN), a local area network (LAN), and other appropriate connections such as Ethernet or others that conform with known ISO, SAE and IEEE standards and specifications, to name but a few.

Telematics unit 30 can be an OEM-installed (embedded) or aftermarket device that is installed in the vehicle and that enables wireless voice and/or data communication over wireless carrier system 14 and via wireless networking. This enables the vehicle to communicate with call center 20, other telematics-enabled vehicles, or some other entity or device. The telematics unit preferably uses radio transmissions to establish a communications channel (a voice channel and/or a data channel) with wireless carrier system 14 so that voice and/or data transmissions can be sent and received over the channel. By providing both voice and data communication, telematics unit 30 enables the vehicle to offer a number of different services including those related to navigation, telephony, emergency assistance, diagnostics, infotainment, etc. Data can be sent either via a data connection, such as via packet data transmission over a data channel, or via a voice channel using techniques known in the art. For combined services that involve both voice communication (e.g., with a live advisor or voice response unit at the call center 20) and data communication (e.g., to provide GPS location data or vehicle diagnostic data to the call center 20), the system can utilize a single call over a voice channel and switch as needed between voice and data transmission over the voice channel, and this can be done using techniques known to those skilled in the art.

According to one embodiment, telematics unit 30 utilizes cellular communication according to either GSM or CDMA standards and thus includes a standard cellular chipset 50 for voice communications like hands-free calling, a wireless modem for data transmission, an electronic processing device 52, one or more digital memory devices 54, and a dual antenna 56. It should be appreciated that the modem can either be implemented through software that is stored in the telematics unit and is executed by processor 52, or it can be a separate hardware component located internal or external to telematics unit 30. The modem can operate using any number of different standards or protocols such as EVDO, CDMA, GPRS, and EDGE. Wireless networking between the vehicle and other networked devices can also be carried out using telematics unit 30. For this purpose, telematics unit 30 can be configured to communicate wirelessly according to one or more wireless protocols, such as any of the IEEE 802.11 protocols, WiMAX, or Bluetooth. When used for packet-switched data communication such as TCP/IP, the telematics unit can be configured with a static IP address or can set up to automatically receive an assigned IP address from another device on the network such as a router or from a network address server.

Processor 52 can be any type of device capable of processing electronic instructions including microprocessors, microcontrollers, host processors, controllers, vehicle communication processors, and application specific integrated circuits (ASICs). It can be a dedicated processor used only for telematics unit 30 or can be shared with other vehicle systems. Processor 52 executes various types of digitally-stored instructions, such as software or firmware programs stored in memory 54, which enable the telematics unit to provide a wide variety of services. For instance, processor 52 can execute programs or process data to carry out at least a part of the method discussed herein.

Telematics unit 30 can be used to provide a diverse range of vehicle services that involve wireless communication to and/or from the vehicle. Such services include: turn-by-turn directions and other navigation-related services that are provided in conjunction with the GPS-based vehicle navigation module 40; airbag deployment notification and other emergency or roadside assistance-related services that are provided in connection with one or more collision sensor interface modules such as a body control module (not shown); diagnostic reporting using one or more diagnostic modules; and infotainment-related services where music, webpages, movies, television programs, videogames and/or other information is downloaded by an infotainment module (not shown) and is stored for current or later playback. The above-listed services are by no means an exhaustive list of all of the capabilities of telematics unit 30, but are simply an enumeration of some of the services that the telematics unit is capable of offering. Furthermore, it should be understood that at least some of the aforementioned modules could be implemented in the form of software instructions saved internal or external to telematics unit 30, they could be hardware components located internal or external to telematics unit 30, or they could be integrated and/or shared with each other or with other systems located throughout the vehicle, to cite but a few possibilities. In the event that the modules are implemented as VSMs 42 located external to telematics unit 30, they could utilize vehicle bus 44 to exchange data and commands with the telematics unit.

GPS module 40 receives radio signals from a constellation 60 of GPS satellites. From these signals, the module 40 can determine vehicle position that is used for providing navigation and other position-related services to the vehicle driver. Navigation information can be presented on the display 38 (or other display within the vehicle) or can be presented verbally such as is done when supplying turn-by-turn navigation. The navigation services can be provided using a dedicated in-vehicle navigation module (which can be part of GPS module 40), or some or all navigation services can be done via telematics unit 30, wherein the position information is sent to a remote location for purposes of providing the vehicle with navigation maps, map annotations (points of interest, restaurants, etc.), route calculations, and the like. The position information can be supplied to call center 20 or other remote computer system, such as computer 18, for other purposes, such as fleet management. Also, new or updated map data can be downloaded to the GPS module 40 from the call center 20 via the telematics unit 30.

Apart from the audio system 36 and GPS module 40, the vehicle 12 can include other vehicle system modules (VSMs) 42 in the form of electronic hardware components that are located throughout the vehicle and typically receive input from one or more sensors and use the sensed input to perform diagnostic, monitoring, control, reporting and/or other functions. Each of the VSMs 42 is preferably connected by communications bus 44 to the other VSMs, as well as to the telematics unit 30, and can be programmed to run vehicle system and subsystem diagnostic tests. As examples, one VSM 42 can be an engine control module (ECM) that controls various aspects of engine operation such as fuel ignition and ignition timing, another VSM 42 can be a powertrain control module that regulates operation of one or more components of the vehicle powertrain, and another VSM 42 can be a body control module that governs various electrical components located throughout the vehicle, like the vehicle's power door locks and headlights. According to one embodiment, the engine control module is equipped with on-board diagnostic (OBD) features that provide myriad real-time data, such as that received from various sensors including vehicle emissions sensors, and provide a standardized series of diagnostic trouble codes (DTCs) that allow a technician to rapidly identify and remedy malfunctions within the vehicle. As is appreciated by those skilled in the art, the above-mentioned VSMs are only examples of some of the modules that may be used in vehicle 12, as numerous others are also possible.

Vehicle electronics 28 also includes a number of vehicle user interfaces that provide vehicle occupants with a means of providing and/or receiving information, including microphone 32, pushbuttons(s) 34, audio system 36, and visual display 38. As used herein, the term 'vehicle user interface' broadly includes any suitable form of electronic device, including both hardware and software components, which is located on the vehicle and enables a vehicle user to communicate with or through a component of the vehicle. Microphone 32 provides audio input to the telematics unit to enable the driver or other occupant to provide voice commands and carry out hands-free calling via the wireless carrier system 14. For this purpose, it can be connected to an on-board automated voice processing unit utilizing human-machine interface (HMI) technology known in the art. The pushbutton(s) 34 allow manual user input into the telematics unit 30 to initiate wireless telephone calls and provide other data, response, or control input. Separate pushbuttons can be used for initiating emergency calls versus regular service assistance calls to the call center 20. Audio system 36 provides audio output to a vehicle occupant and can be a dedicated, stand-alone system or part of the primary vehicle audio system. According to the particular embodiment shown here, audio system 36 is operatively coupled to both vehicle bus 44 and entertainment bus 46 and can provide AM, FM and satellite radio, CD, DVD and other multimedia functionality. This functionality can be provided in conjunction with or independent of the infotainment module described above. Visual display 38 is preferably a graphics display, such as a touch screen on the instrument panel or a heads-up display reflected off of the windshield, and can be used to provide a multitude of input and output functions. Various other vehicle user interfaces can also be utilized, as the interfaces of FIG. 1 are only an example of one particular implementation.

Wireless carrier system 14 is preferably a cellular telephone system that includes a plurality of cell towers 70 (only one shown), one or more mobile switching centers (MSCs) 72, as well as any other networking components required to connect wireless carrier system 14 with land network 16. Each cell tower 70 includes sending and receiving antennas and a base station, with the base stations from different cell towers being connected to the MSC 72 either directly or via intermediary equipment such as a base station controller. Cellular system 14 can implement any suitable communications technology, including for example, analog technologies such as AMPS, or the newer digital technologies such as CDMA (e.g., CDMA2000) or GSM/GPRS. As will be appreciated by those skilled in the art, various cell tower/base station/MSC arrangements are possible and could be used with wireless system 14. For instance, the base station and cell tower could be co-located at the same site or they could be remotely located from one another, each base station could be responsible for a single cell tower or a single base station could service various cell towers, and various base stations could be coupled to a single MSC, to name but a few of the possible arrangements.

Apart from using wireless carrier system 14, a different wireless carrier system in the form of satellite communication can be used to provide uni-directional or bi-directional communication with the vehicle. This can be done using one or more communication satellites 62 and an uplink transmitting station 64. Uni-directional communication can be, for example, satellite radio services, wherein programming content (news, music, etc.) is received by transmitting station 64, packaged for upload, and then sent to the satellite 62, which broadcasts the programming to subscribers. Bi-directional communication can be, for example, satellite telephony services using satellite 62 to relay telephone communications between the vehicle 12 and station 64. If used, this satellite telephony can be utilized either in addition to or in lieu of wireless carrier system 14.

Land network 16 may be a conventional land-based telecommunications network that is connected to one or more landline telephones and connects wireless carrier system 14 to call center 20. For example, land network 16 may include a public switched telephone network (PSTN) such as that used to provide hardwired telephony, packet-switched data communications, and the Internet infrastructure. One or more segments of land network 16 could be implemented through the use of a standard wired network, a fiber or other optical network, a cable network, power lines, other wireless networks such as wireless local area networks (WLANs), or networks providing broadband wireless access (BWA), or any combination thereof. Furthermore, call center 20 need not be connected via land network 16, but could include wireless telephony equipment so that it can communicate directly with a wireless network, such as wireless carrier system 14.

Computer 18 can be one of a number of computers accessible via a private or public network such as the Internet. Each such computer 18 can be used for one or more purposes, such as a web server accessible by the vehicle via telematics unit 30 and wireless carrier 14. Other such accessible computers 18 can be, for example: a service center computer where diagnostic information and other vehicle data can be uploaded from the vehicle via the telematics unit 30; a client computer used by the vehicle owner or other subscriber for such purposes as accessing or receiving vehicle data or to setting up or configuring subscriber preferences or controlling vehicle functions; or a third party repository to or from which vehicle data or other information is provided, whether by communicating with the vehicle 12 or call center 20, or both. A computer 18 can also be used for providing Internet connectivity such as DNS services or as a network address server that uses DHCP or other suitable protocol to assign an IP address to the vehicle 12.

Call center 20 is designed to provide the vehicle electronics 28 with a number of different system back-end functions and, according to the exemplary embodiment shown here, generally includes one or more switches 80, servers 82, databases 84, live advisors 86, as well as an automated voice response system (VRS) 88, all of which are known in the art. These various call center components are preferably coupled to one another via a wired or wireless local area network 90. Switch 80, which can be a private branch exchange (PBX) switch, routes incoming signals so that voice transmissions are usually sent to either the live adviser 86 by regular phone or to the automated voice response system 88 using VoIP. The live advisor phone can also use VoIP as indicated by the broken line in FIG. 1. VoIP and other data communication through the switch 80 is implemented via a modem (not shown) connected between the switch 80 and network 90. Data transmissions are passed via the modem to server 82 and/or database 84. Database 84 can store account information such as subscriber authentication information, vehicle identifiers, profile records, behavioral patterns, and other pertinent subscriber information. Data transmissions may also be conducted by wireless systems, such as 802.11x, GPRS, and the like. Although the illustrated embodiment has been described as it would be used in conjunction with a manned call center 20 using live advisor 86, it will be appreciated that the call center can instead utilize VRS 88 as an automated advisor or, a combination of VRS 88 and the live advisor 86 can be used.

Automatic Speech Recognition System—

Figure 2:
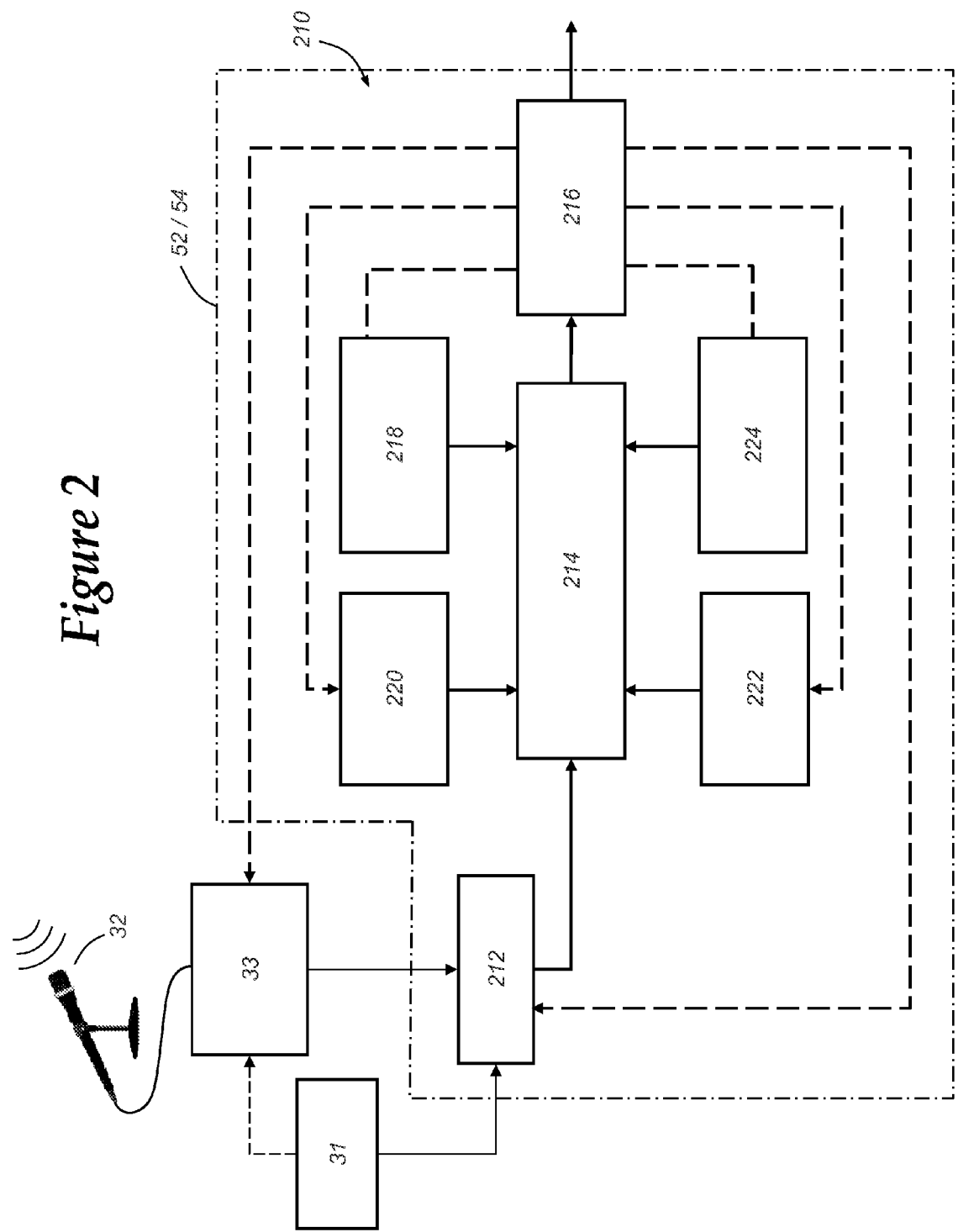
FIG. 2 is a block diagram depicting an embodiment of an automatics speech recognition (ASR) system capable of utilizing the method disclosed herein.

Turning now to FIG. 2, there is shown an illustrative architecture for an ASR system 210 that can be used to enable the presently disclosed method. In general, a vehicle occupant vocally interacts with an automatic speech recognition (ASR) system for one or more of the following fundamental purposes: training the system to understand a vehicle occupant's particular voice; storing discrete speech such as a spoken nametag or a spoken control word like a numeral or keyword; or recognizing the vehicle occupant's speech for any suitable purpose such as voice dialing, menu navigation, transcription, service requests, vehicle device or device function control, or the like. Generally, ASR extracts acoustic data from human speech, compares and contrasts the acoustic data to stored subword data, selects an appropriate subword which can be concatenated with other selected subwords, and outputs the concatenated subwords or words for post-processing such as dictation or transcription, address book dialing, storing to memory, training ASR models or adaptation parameters, or the like.

ASR systems are generally known to those skilled in the art, and FIG. 2 illustrates just one specific illustrative ASR system 210. The system 210 includes a device to receive speech such as the telematics microphone 32, and an acoustic interface 33 such as a sound card of the telematics unit 30 having an analog to digital converter to digitize the speech into acoustic data. The system 210 also includes a memory such as the telematics memory 54 for storing the acoustic data and storing speech recognition software and databases, and a processor such as the telematics processor 52 to process the acoustic data. The processor functions with the memory and in conjunction with the following modules: one or more front-end processors or pre-processor software modules 212 for parsing streams of the acoustic data of the speech into parametric representations such as acoustic features; one or more decoder software modules 214 for decoding the acoustic features to yield digital subword or word output data corresponding to the input speech utterances; and one or more post-processor software modules 216 for using the output data from the decoder module(s) 214 for any suitable purpose.

The system 210 can also receive speech from any other suitable audio source(s) 31, which can be directly communicated with the pre-processor software module(s) 212 as shown in solid line or indirectly communicated therewith via the acoustic interface 33. The audio source(s) 31 can include, for example, a telephonic source of audio such as a voice mail system, or other telephonic services of any kind.

One or more modules or models can be used as input to the decoder module(s) 214. First, grammar and/or lexicon model(s) 218 can provide rules governing which words can logically follow other words to form valid sentences. In a broad sense, a grammar can define a universe of vocabulary the system 210 expects at any given time in any given ASR mode. For example, if the system 210 is in a training mode for training commands, then the grammar model(s) 218 can include all commands known to and used by the system 210. In another example, if the system 210 is in a main menu mode, then the active grammar model(s) 218 can include all main menu commands expected by the system 210 such as call, dial, exit, delete, directory, or the like. Second, acoustic model(s) 220 assist with selection of most likely subwords or words corresponding to input from the pre-processor module(s) 212. Third, word model(s) 222 and sentence/language model(s) 224 provide rules, syntax, and/or semantics in placing the selected subwords or words into word or sentence context. Also, the sentence/language model(s) 224 can define a universe of sentences the system 210 expects at any given time in any given ASR mode, and/or can provide rules, etc., governing which sentences can logically follow other sentences to form valid extended speech.

According to an alternative illustrative embodiment, some or all of the ASR system 210 can be resident on, and processed using, computing equipment in a location remote from the vehicle 12 such as the call center 20. For example, grammar models, acoustic models, and the like can be stored in memory of one of the servers 82 and/or databases 84 in the call center 20 and communicated to the vehicle telematics unit 30 for in-vehicle speech processing. Similarly, speech recognition software can be processed using processors of one of the servers 82 in the call center 20. In other words, the ASR system 210 can be resident in the telematics unit 30, distributed across the call center 20 and the vehicle 12 in any desired manner, and/or resident at the call center 20.

First, acoustic data is extracted from human speech wherein a vehicle occupant speaks into the microphone 32, which converts the utterances into electrical signals and communicates such signals to the acoustic interface 33. A sound-responsive element in the microphone 32 captures the occupant's speech utterances as variations in air pressure and converts the utterances into corresponding variations of analog electrical signals such as direct current or voltage. The acoustic interface 33 receives the analog electrical signals, which are first sampled such that values of the analog signal are captured at discrete instants of time, and are then quantized such that the amplitudes of the analog signals are converted at each sampling instant into a continuous stream of digital speech data. In other words, the acoustic interface 33 converts the analog electrical signals into digital electronic signals. The digital data are binary bits which are buffered in the telematics memory 54 and then processed by the telematics processor 52 or can be processed as they are initially received by the processor 52 in real-time.

Second, the pre-processor module(s) 212 transforms the continuous stream of digital speech data into discrete sequences of acoustic parameters. More specifically, the processor 52 executes the pre-processor module(s) 212 to segment the digital speech data into overlapping phonetic or acoustic frames of, for example, 10-30 ms duration. The frames correspond to acoustic subwords such as syllables, demi-syllables, phones, diphones, phonemes, or the like. The pre-processor module(s) 212 also performs phonetic analysis to extract acoustic parameters from the occupant's speech such as time-varying feature vectors, from within each frame. Utterances within the occupant's speech can be represented as sequences of these feature vectors. For example, and as known to those skilled in the art, feature vectors can be extracted and can include, for example, vocal pitch, energy profiles, spectral attributes, and/or cepstral coefficients that can be obtained by performing Fourier transforms of the frames and decorrelating acoustic spectra using cosine transforms. Acoustic frames and corresponding parameters covering a particular duration of speech are concatenated into unknown test pattern of speech to be decoded.

Third, the processor executes the decoder module(s) 214 to process the incoming feature vectors of each test pattern. The decoder module(s) 214 is also known as a recognition engine or classifier, and uses stored known reference patterns of speech. Like the test patterns, the reference patterns are defined as a concatenation of related acoustic frames and corresponding parameters. The decoder module(s) 214 compares and contrasts the acoustic feature vectors of a subword test pattern to be recognized with stored subword reference patterns, assesses the magnitude of the differences or similarities therebetween, and ultimately uses decision logic to choose a best matching subword as the recognized subword. In general, the best matching subword is that which corresponds to the stored known reference pattern that has a minimum dissimilarity to, or highest probability of being, the test pattern as determined by any of various techniques known to those skilled in the art to analyze and recognize subwords. Such techniques can include dynamic time-warping classifiers, artificial intelligence techniques, neural networks, free phoneme recognizers, and/or probabilistic pattern matchers such as Hidden Markov Model (HMM) engines.

HMM engines are known to those skilled in the art for producing multiple speech recognition model hypotheses of acoustic input. The hypotheses are considered in ultimately identifying and selecting that recognition output which represents the most probable correct decoding of the acoustic input via feature analysis of the speech. More specifically, an HMM engine generates statistical models in the form of an "N-best" list of subword model hypotheses ranked according to HMM-calculated confidence values or probabilities of an observed sequence of acoustic data given one or another subword such as by the application of Bayes' Theorem.

A Bayesian HMM process identifies a best hypothesis corresponding to the most probable utterance or subword sequence for a given observation sequence of acoustic feature vectors, and its confidence values can depend on a variety of factors including acoustic signal-to-noise ratios associated with incoming acoustic data. The HMM can also include a statistical distribution called a mixture of diagonal Gaussians, which yields a likelihood score for each observed feature vector of each subword, which scores can be used to reorder the N-best list of hypotheses. The HMM engine can also identify and select a subword whose model likelihood score is highest.

In a similar manner, individual HMMs for a sequence of subwords can be concatenated to establish single or multiple word HMM. Thereafter, an N-best list of single or multiple word reference patterns and associated parameter values may be generated and further evaluated.

In one example, the speech recognition decoder 214 processes the feature vectors using the appropriate acoustic models, grammars, and algorithms to generate an N-best list of reference patterns. As used herein, the term reference patterns is interchangeable with models, waveforms, templates, rich signal models, exemplars, hypotheses, or other types of references. A reference pattern can include a series of feature vectors representative of one or more words or subwords and can be based on particular speakers, speaking styles, and audible environmental conditions. Those skilled in the art will recognize that reference patterns can be generated by suitable reference pattern training of the ASR system and stored in memory. Those skilled in the art will also recognize that stored reference patterns can be manipulated, wherein parameter values of the reference patterns are adapted based on differences in speech input signals between reference pattern training and actual use of the ASR system. For example, a set of reference patterns trained for one vehicle occupant or certain acoustic conditions can be adapted and saved as another set of reference patterns for a different vehicle occupant or different acoustic conditions, based on a limited amount of training data from the different vehicle occupant or the different acoustic conditions. In other words, the reference patterns are not necessarily fixed and can be adjusted during speech recognition.

Using the in-vocabulary grammar and any suitable decoder algorithm(s) and acoustic model(s), the processor accesses from memory several reference patterns interpretive of the test pattern. For example, the processor can generate, and store to memory, a list of N-best vocabulary results or reference patterns, along with corresponding parameter values. Illustrative parameter values can include confidence scores of each reference pattern in the N-best list of vocabulary and associated segment durations, likelihood scores, signal-to-noise ratio (SNR) values, and/or the like. The N-best list of vocabulary can be ordered by descending magnitude of the parameter value(s). For example, the vocabulary reference pattern with the highest confidence score is the first best reference pattern, and so on. Once a string of recognized subwords are established, they can be used to construct words with input from the word models 222 and to construct sentences with the input from the language models 224.

Finally, the post-processor software module(s) 216 receives the output data from the decoder module(s) 214 for any suitable purpose. In one example, the post-processor software module(s) 216 can identify or select one of the reference patterns from the N-best list of single or multiple word reference patterns as recognized speech. In another example, the post-processor module(s) 216 can be used to convert acoustic data into text or digits for use with other aspects of the ASR system or other vehicle systems. In a further example, the post-processor module(s) 216 can be used to provide training feedback to the decoder 214 or pre-processor 212. More specifically, the post-processor 216 can be used to train acoustic models for the decoder module(s) 214, or to train adaptation parameters for the pre-processor module(s) 212.

The method or parts thereof can be implemented in a computer program product embodied in a computer readable medium and including instructions usable by one or more processors of one or more computers of one or more systems to cause the system(s) to implement one or more of the method steps. The computer program product may include one or more software programs comprised of program instructions in source code, object code, executable code or other formats; one or more firmware programs; or hardware description language (HDL) files; and any program related data. The data may include data structures, look-up tables, or data in any other suitable format. The program instructions may include program modules, routines, programs, objects, components, and/or the like. The computer program can be executed on one computer or on multiple computers in communication with one another.

The program(s) can be embodied on computer readable media, which can be non-transitory and can include one or more storage devices, articles of manufacture, or the like. Exemplary computer readable media include computer system memory, e.g. RAM (random access memory), ROM (read only memory); semiconductor memory, e.g. EPROM (erasable, programmable ROM), EEPROM (electrically erasable, programmable ROM), flash memory; magnetic or optical disks or tapes; and/or the like. The computer readable medium may also include computer to computer connections, for example, when data is transferred or provided over a network or another communications connection (either wired, wireless, or a combination thereof). Any combination(s) of the above examples is also included within the scope of the computer-readable media. It is therefore to be understood that the method can be at least partially performed by any electronic articles and/or devices capable of carrying out instructions corresponding to one or more steps of the disclosed method.

Figure 3:
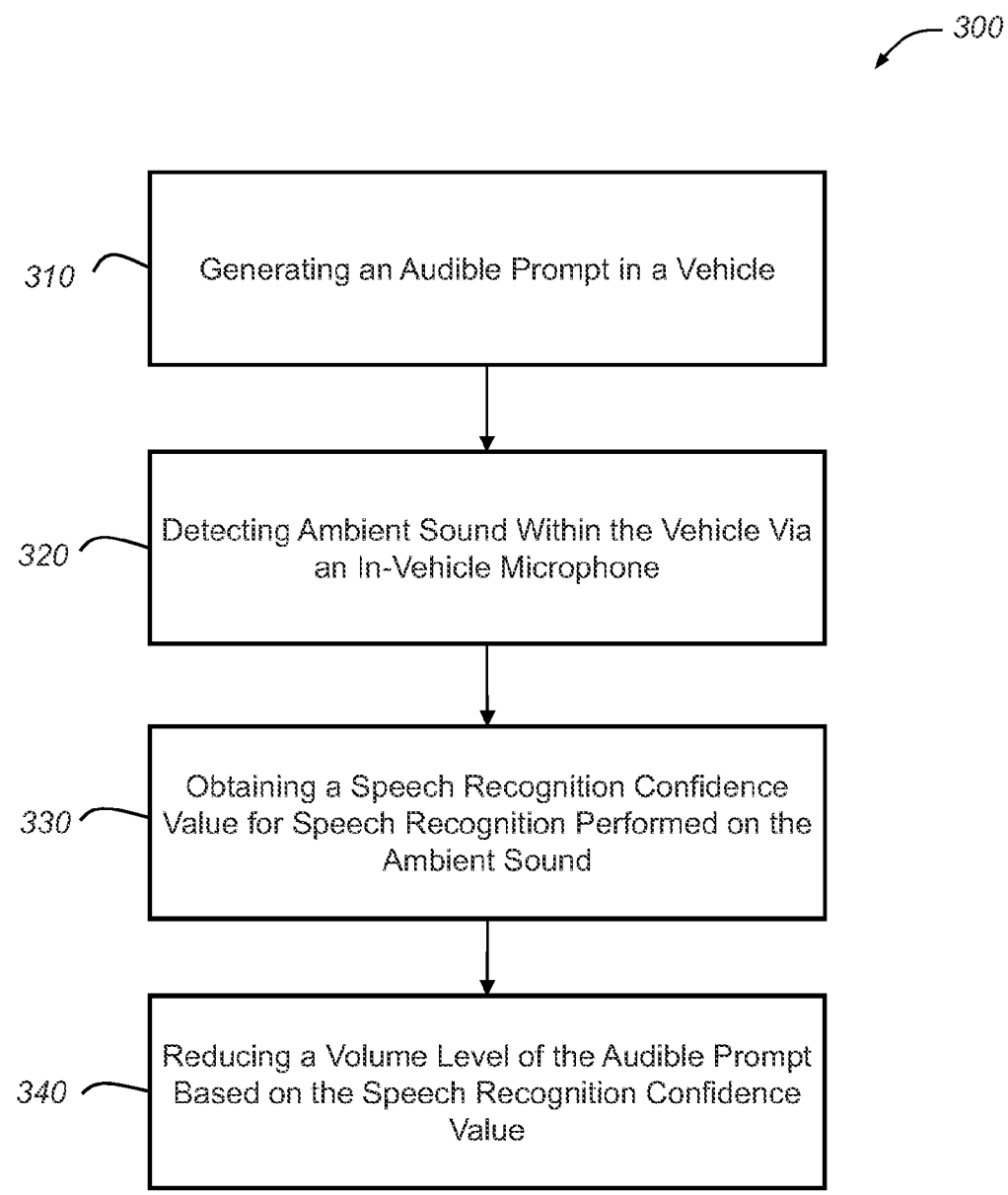
FIG. 3 is a flow chart depicting an embodiment of a method of regulating ASR playback of audible prompts.

Turning now to FIG. 3, there is shown an embodiment of a method 300 of regulating automatic speech recognition (ASR) playback of audible prompts. The method 300 begins at step 310 by generating an audible prompt in the vehicle 12. As part of interacting with a vehicle occupant or user, the ASR system 210 can generate audible prompts to the occupant via a speaker using the ASR system 210. The audible prompts can be played through the audio system 36 so that they are heard by a user/vehicle occupant. The prompts can identify one or more options the user can select from as part of interacting with the ASR system 210. For example, the ASR system 210 can receive verbal commands from the user as part of turn-by-turn directions or voice dialing. Along with receiving the verbal commands, the ASR system 210 can audibly generate prompts for carrying out these options, such as "please say the beginning address" or "please provide the telephone number you want to dial" to carry out navigation and voice dialing, respectively. The audible prompts can also include a list of vehicle functions that can be controlled by the user with verbal prompts, such as "navigation," "turn-by-turn directions," or "call center assistance." The method 300 proceeds to step 320.

At step 320, ambient sound is detected within the vehicle 12 via an in-vehicle microphone 32. While the audible prompts are being generated or played at the vehicle 12, the ASR system 210 can detect ambient sound received at the microphone 32 that has not been generated by the audible prompt. The ambient sound can be speech from the user that interrupts the prompt. When speech is detected, the prompt can end and the speech will be interpreted by the ASR system 210. However, the ambient sound can alternatively be generated by something other than the user. A wide range of sounds can be received by the microphone 32 other than user speech providing input to the ASR system 210. For example, the user may cough, a dog may bark, or a nearby vehicle may honk its horn. Each of these examples of sound attributed to sources other than the user can be received by the ASR system 210 while the acoustic prompts are played. The ambient sound can then be processed using one or more speech recognition modules discussed above to differentiate between speech from the user and noise generated from sources other than the user. In one implementation, the ASR system 210 can extract acoustic parameters from the ambient sound using the pre-processor module 212. The method 300 proceeds to step 330.

At step 330, a speech recognition confidence value is obtained for speech recognition performed on the ambient sound. The confidence values can be determined by the decoder module 214 using a recognition engine classifier to generate a probabilistic calculation for the content of the ambient sound. When the ambient sound includes user speech, the speech recognition confidence value attributed to the ambient sound can be relatively high. The speech recognition confidence value can reflect a hypothesis word or words that have been identified in the ambient sound and the probability that the content of the ambient sound matches the hypothesis word(s). In one example, if the speech recognition confidence value is greater than 90%, then the ASR system 210 can determine that the ambient sound includes user speech. If the confidence value lies between 50-90%, then the ASR system 210 can determine that it is possible that the ambient sound includes sound other than user speech. As a result, a volume level of the audible prompt can be controlled in a linear relationship to the confidence value. For instance, if the ASR system 210 generates a 80% speech recognition confidence value for the ambient sound, the ASR system 210 can establish a volume level for the audible prompt that is 80% of a standard playback volume. Similarly, when the ASR system 210 generates a 50% speech recognition confidence value, the ASR system 210 can establish a volume level for the audible prompt that is 50% of a standard playback volume.

In another implementation, the relationship between the speech recognition confidence value and the volume level of the audible prompt can be non-linear. In one example of the non-linear relationship, the ASR system 210 can continuously perform speech recognition on the ambient sound and generate a plurality of speech recognition confidence values. As the ASR system 210 generates the speech recognition confidence values, the ASR system 210 can calculate a volume level by calculating the differential between each confidence value. The volume level of the audible prompt can rise and fall in relation to the rise and fall of the magnitude of the differential. For example, when the speech recognition confidence value falls from 90% to 70% and the falls again to 60%, the ASR system 210 can detect that the magnitude of the differential value is falling and then reduce the volume level of the audible prompt by the average of the two differential values—in this case, 15%. The method 300 can be carried out over limited time period. In one implementation, this time period can be less than 2 seconds. The method proceeds to step 340.

At step 340, a volume level of the audible prompt is reduced while the audible prompt is played or generated. The ASR system 210 can control the volume level of the audible prompt based on the determinations made during step 330. As the audible prompt is playing, the ASR system 210 can generate a value at which the volume level of the audio system 36 will be set. As the ASR system 210 generates new volume levels, the system 210 can change the volume of the audible prompt upward or downward in response to the new volume levels. The method 300 then ends.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having." "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of regulating automatic speech recognition (ASR) playback of audible prompts, comprising the steps of:
   (a) generating an audible prompt via a speaker;
   (b) detecting ambient sound during the audible prompt via a microphone;
   (c) obtaining a speech recognition confidence value for speech recognition performed on the ambient sound and the audible prompt, wherein the speech recognition confidence value indicates a level of confidence that the ambient sound includes human speech during the generation of the audible prompt; and
   (d) adjusting a volume level of the audible prompt based on the speech recognition confidence value indicating the presence of human speech during the audible prompt while continuing to generate the audible prompt.

2. The method of claim 1, further comprising the step of playing the audible prompt through an audio system of a vehicle.

3. The method of claim 1, further comprising the step of adjusting the volume level of the audible prompt in a linear relationship to the speech recognition confidence value.

4. The method of claim 1, further comprising the step of adjusting the volume level of the audible prompt in a non-linear relationship to the speech recognition confidence value.

5. The method of claim 1, further comprising the steps of determining that the ambient sound includes user speech and ending the audible prompt.

6. A method of regulating automatic speech recognition (ASR) playback of audible prompts, comprising the steps of:
   (a) generating an audible prompt in the vehicle via a speaker;
   (b) detecting ambient sound within the vehicle via an in-vehicle microphone;
   (c) performing speech recognition on the ambient sound and the audible prompt;
   (d) obtaining a speech recognition confidence value for the speech recognition performed on the ambient sound and the audible prompt, wherein the speech recognition confidence value indicates a level of confidence that the ambient sound includes human speech during the generation of the audible prompt; and
   (e) adjusting a volume level of the audible prompt in relation to the speech recognition confidence value indicating the presence of human speech during the audible prompt.

7. The method of claim 6, further comprising the step of adjusting the volume level of the audible prompt in a linear relationship to the speech recognition confidence value.

8. The method of claim 6, further comprising the step of adjusting reducing the volume level of the audible prompt in a non-linear relationship to the speech recognition confidence value.

9. The method of claim 6, further comprising the steps of determining that the ambient sound includes user speech and ending the audible prompt.

* * * * *